(12) United States Patent
Terui et al.

(10) Patent No.: US 8,409,930 B2
(45) Date of Patent: Apr. 2, 2013

(54) SEMICONDUCTOR DEVICE MANUFACTURING METHOD

(75) Inventors: Makoto Terui, Yamanashi (JP); Yasushi Shiraishi, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 222 days.

(21) Appl. No.: 13/071,741

(22) Filed: Mar. 25, 2011

(65) Prior Publication Data
US 2011/0171779 A1 Jul. 14, 2011

Related U.S. Application Data

(62) Division of application No. 12/052,074, filed on Mar. 20, 2008, now Pat. No. 7,932,597.

(30) Foreign Application Priority Data

Mar. 27, 2007 (JP) ................... 2007-081852

(51) Int. Cl.
*H01L 21/58* (2006.01)
(52) U.S. Cl. ........ 438/122; 438/106; 438/108; 438/121; 438/118; 257/E23.101; 257/717

(58) Field of Classification Search .................. 257/717, 257/E23.101; 438/108, 107, 122, 121, 106, 438/118
See application file for complete search history.

(56) References Cited

U.S. PATENT DOCUMENTS

| 7,193,320 B2* | 3/2007 | Hosoyamada et al. ........ 257/738 |
| 7,786,591 B2* | 8/2010 | Khan et al. .................... 257/777 |
| 2005/0104196 A1* | 5/2005 | Kashiwazaki ................ 257/706 |
| 2008/0006934 A1* | 1/2008 | Zhao et al. .................... 257/713 |

FOREIGN PATENT DOCUMENTS

JP 2003078104 3/2003

* cited by examiner

*Primary Examiner* — S. V. Clark
*Assistant Examiner* — Krista Soderholm
(74) *Attorney, Agent, or Firm* — Volentine & Whitt, PLLC

(57) ABSTRACT

A BGA substrate which has a back surface to which a heat radiating plate is attached and an opening for accommodating a relay wiring substrate therein, which is provided in the center of its surface, is used. The relay wiring substrate to which an ASIC chip and a memory chip are flip-chip connected, is bonded to the heat radiating plate in the opening with a thermal conductive bonding material. Further, each of the back surfaces of the ASIC chip and the memory chip is connected to a metal cap for sealing the opening through a thermal conductive material interposed therebetween.

20 Claims, 3 Drawing Sheets

SEMICONDUCTOR DEVICE MANUFACTURING METHOD

CROSS-REFERENCE TO RELATED APPLICATIONS

This application is a divisional application of application Ser. No. 12/052,074 filed Mar. 20, 2008, which is hereby incorporated for all purposes. This application claims priority under 35 U.S.C. 119 from Japanese Patent Application No. JP2007-081852, the disclosure of which is incorporated by reference herein.

BACKGROUND OF THE INVENTION

The present invention relates to a semiconductor device in which a plurality of semiconductor chips are mounted onto one package using a relay wiring substrate (interposer), and a manufacturing method thereof.

FIG. 2 is a configuration diagram of a conventional semiconductor device described in a patent document 1 (Japanese Unexamined Patent Publication No. 2003-78104).

The semiconductor device includes lower-stage semiconductor chips or elements 101 and 102 face-down mounted in such a manner that their circuit surfaces face a multilayer circuit substrate 200, and an upper-stage semiconductor chip or element 103 mounted astride the two semiconductor elements 101 and 102. The semiconductor element 103 is face-down mounted in such a manner that its circuit surface faces the semiconductor elements 101 and 102.

The semiconductor element 101 is electrically connected to primary pads 211 of the multilayer circuit substrate 200 by gold bumps 121 formed on their corresponding pads 111. An adhesive or bonding resin 401 is interposed between the semiconductor element 101 and the multilayer circuit substrate 200. Incidentally, the semiconductor element 102 is also connected to the multilayer circuit substrate 200 in a manner similar to the semiconductor element 101.

On the other hand, each of pads 113 formed on the circuit surface of the semiconductor element 103 is electrically connected to a primary pad 213 formed on the surface of the multilayer circuit substrate 200 via a tape wiring 301 and a bonding wire 302. The tape wiring 301 and each of the semiconductor elements 101 and 102 are electrically connected by an insulating layer 402.

The respective primary pads 211 and 213 of the multilayer circuit substrate 200 are respectively connected to secondary pads 241 and 243 provided on the back surface of the multilayer circuit substrate 200 via through holes. External terminals 261 and 263 are provided on the secondary pads 241 and 243 respectively.

The semiconductor element mounting face side of the multilayer circuit substrate 200 is sealed with a resin 408. A metal heat radiating plate 410 is mounted on the back surface of the semiconductor element 103 through a thermal conducive adhesive or bonding material 409 interposed therebetween.

According to such a layered semiconductor device, it can efficiently diffuse heat generated at the semiconductor element 103 large in heating value through the heat radiating plate 410 and is suitable even for heat radiation into chassis or casing or the like.

Although, however, the heat generated at the semiconductor element 103 can be radiated through the heat radiating plate 410 provided on the back surface of the semiconductor element 103 in the semiconductor device, the heat generated at the inner semiconductor elements 101 and 102 cannot be radiated. Therefore, there is a fear that a radiating effect is not sufficient as the case may be, and the inner semiconductor elements 101 and 102 are subjected to high temperatures, thereby causing a malfunction.

SUMMARY OF THE INVENTION

With the foregoing in view, the present invention aims to enhance a radiating effect at a semiconductor device in which a plurality of semiconductor chips are mounted onto one package using a relay wiring substrate.

According to one aspect of the present invention, for attaining the above object, there is provided a semiconductor device comprising a plurality of semiconductor chips flip-chip connected to a surface of a relay wiring substrate, a main wiring substrate which has an opening accommodating therein the relay wiring substrate equipped with the semiconductor chips and in which wiring from the relay wiring substrate to external terminals provided over a surface of the main wiring substrate is performed, a heat radiating plate attached to a back surface of the main wiring substrate, a bonding material having thermal conductivity, which bonds a back surface of the relay wiring substrate accommodated in the main wiring substrate to the heat radiating plate, a metal sealing plate which covers the opening of the main wiring substrate, and a thermal conductive material interposed between the sealing plate and each of the semiconductor chips.

In the present invention, a main wiring substrate is provided which has a back surface on which a heat radiating plate is attached and a surface covered with a metal sealing plate which covers an opening for accommodating a relay wiring substrate. The relay wiring substrate is bonded to the heat radiating plate with a thermal conductive adhesive or bonding material. A plurality of semiconductor chips flip-chip connected to the relay wiring substrate are connected to the sealing plate through thermal conductive materials interposed therebetween.

Thus, heat generated at each semiconductor chip is conducted to the heat radiating plate via the relay wiring substrate and radiated outside. Further, the heat is conducted to the metal sealing plate via the thermal conductive materials. Accordingly, if the sealing plate is soldered to a mounting board, then the heat generated at each semiconductor chip is conducted from the sealing plate to an earth wire or the like of the mounting board through solder and diffused therefrom. Therefore, an advantageous effect is brought about in that a heating effect is enhanced as compared with a conventional semiconductor device provided with a heat radiating plate only on the back surface of a main wiring substrate such as a BGA substrate.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

The above and other objects and novel features of the present invention will become more completely apparent from the following descriptions of preferred embodiments when the same is read with reference to the accompanying drawings. The drawings, however, are for the purpose of illustration only and by no means limitative of the scope of the invention.

First Preferred Embodiment

Figure 1:
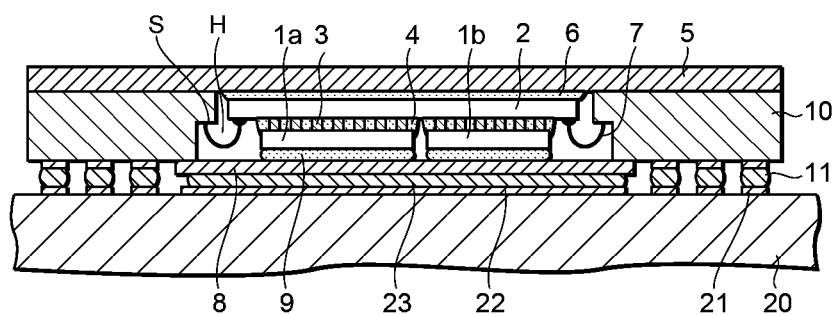
FIG. 1 is a configuration diagram of a semiconductor device showing a first embodiment of the present invention.
Figure 2:
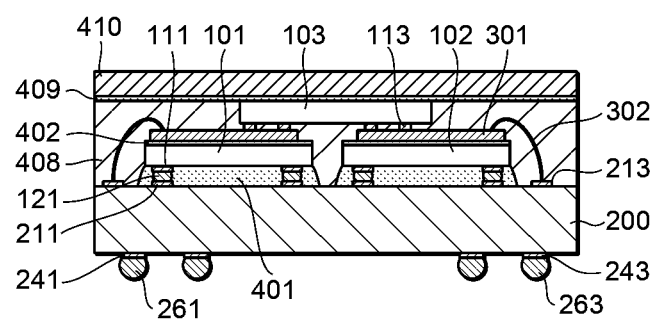
FIG. 2 is a configuration diagram of a conventional semiconductor device.

FIG. 1 is a configuration diagram of a semiconductor device showing a first embodiment of the present invention.

The semiconductor device is a semiconductor device of an SIP (System in Package) structure wherein a control LSI such as an ASIC (Application Specified IC), a micro controller or the like, and a general-purpose LSI such as a memory are combined into one package.

The semiconductor device has a relay wiring substrate 2 which is equipped with an ASIC chip 1a and a memory chip 1b and which performs wiring between these chips. It is generally known that the ASIC chip 1a is large in heating value and the memory chip 1b is weak in heat or heat-sensitive as compared with the ASIC chip 1a. The relay wiring substrate 2 is one in which aluminum wirings each having a wiring pitch of 100 μm or less are formed in a silicon substrate. The ASIC chip 1a and the memory chip 1b respectively formed with micro bumps 3 each having a diameter of 50 μm or less are mounted on the aluminum wirings of the relay wiring substrate 2 by a flip-chip connection technique. An underfill resin 4 is charged between the flip-chip connected ASIC chip 1a and memory chip 1b and the relay wiring substrate 2.

On the other hand, a main wiring substrate that is an essential part of the package and performs wiring between the relay wiring substrate 2 and external terminals, is configured as a BGA (Ball Grid Array) substrate 10. The BGA substrate 10 is a wiring substrate in which a plurality of wiring layers are multilayered through insulative resin layers interposed therebetween, and is equivalent to one in which spherical external terminals 11 for connecting to a mounting board 20 are regularly arranged so as to correspond to cross points of a lattice. Such an opening H that the relay wiring substrate 2 fits therein is provided in the center of the BGA substrate 10. Steplike portions S are formed around the opening H, and one ends of unillustrated wirings connected to the respective external terminals 11 are led out to the steplike portions S.

A heat radiating plate 5 made of a metal such as copper having high thermal conductivity is attached to the back surface (corresponding to the surface on which the external terminals 11 are not provided) of the BGA substrate 10 so as to cover the whole back surface. The back surface of the relay wiring substrate 2 is mounted to the inside of the heat radiating plate 5 corresponding to the opening H of the BGA substrate 10 by an adhesive or bonding material 6. Bonding wires 7 electrically connect between aluminum electrodes led out to the peripheral portion of the relay wiring substrate 2 and the wirings led out to the steplike portions S of the BGA substrate 10.

The opening H of the BGA substrate 10 in which the relay wiring substrate 2 equipped with the ASIC chip 1a and the memory chip 1b is mounted, is sealed with a metal cap 8. At this time, a thermal conductive material 9 having an insulating property, such as thermal conductive grease or thermal conductive gel is charged between each of the back surfaces of the ASIC chip 1a and the memory chip 1b and the metal cap 8.

When the semiconductor device is mounted on the mounting board, the external terminals 11 are connected to their corresponding wiring patterns 21 provided on the surface of the mounting board 20, and the metal cap 8 is connected to an earth wire 22 or the like provided on the mounting board 20 by solder 23 or the like.

FIG. 3 is an outline process diagram showing a method of manufacturing the semiconductor device shown in FIG. 1. The method for manufacturing the semiconductor device shown in FIG. 1 will be explained below with reference to FIG. 3. Incidentally, the semiconductor devices are opposite in direction in FIGS. 3 and 1.

(1) Step 1

Figure 3A:
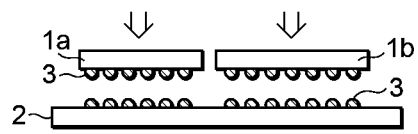
FIG. 3 is an outline process diagram illustrating a method for manufacturing the semiconductor device shown in FIG. 1.

As shown in FIG. 3A, an ASIC chip 1a and a memory chip 1b are flip-chip connected onto a relay wiring substrate 2 using micro bumps 3.

(2) Step 2

Figure 3B:
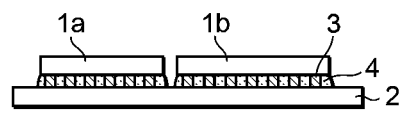

As shown in FIG. 3B, an underfill resin 4 is charged between the flip-chip connected ASIC chip 1a and memory chip 1b and the relay wiring substrate 2.

(3) Step 3

Figure 3C:
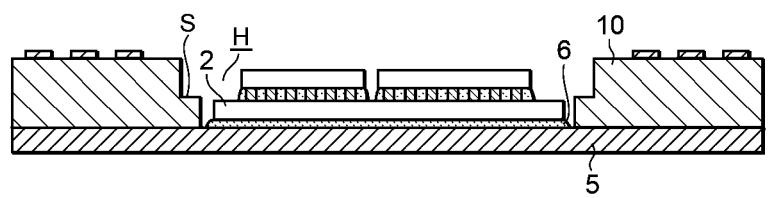

As shown in FIG. 3C, a BGA substrate 10, which is provided with such an opening H that the relay wiring substrate 2 fits in the center thereof and which is given wiring between steplike portions S provided around the opening H and the surface thereof and has a back surface on which a heat radiating plate 5 is attached, is prepared. Then, the relay wiring substrate 2 assembled at Step 2 is bonded and mounted to the inside of the heat radiating plate 5 in the opening H of the BGA substrate 10 by an adhesive or bonding material 6 having thermal conductivity.

(4) Step 4

Figure 3D:
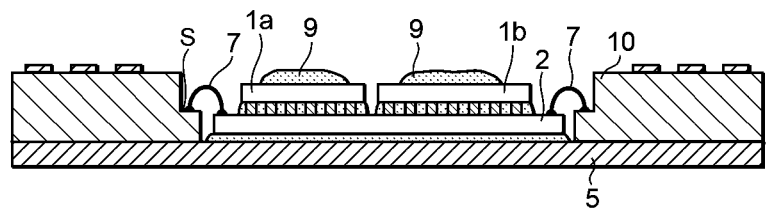

As shown in FIG. 3D, bonding wires 7 electrically connect between aluminum electrodes led out to the peripheral portion of the relay wiring substrate 2 and wirings led out to the steplike portions S of the BGA substrate 10. Further, thermal conductive materials 9 are suitably applied, in proper quantity, onto the ASIC chip 1a and the memory chip 1b both flip-chip connected to the relay wiring substrate 2.

(5) Step 5

Figure 3E:
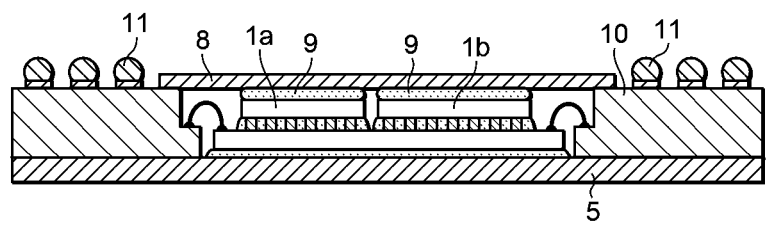

As shown in FIG. 3E, a metal cap 8 is placed so as to cover the opening H of the BGA substrate 10 and its periphery is adhered thereto. At this time, it is necessary to set the amounts of the thermal conductive materials applied at Step 4 in such a manner that the thermal conductive materials 9 are charged between the metal cap 8 and both the AISC chip 1a and the memory chip 1b.

After the opening H is blocked with the metal cap 8, external terminals 11 such as solder balls are mounted onto the peripheral portion of the BGA substrate 10. Thus, such a semiconductor device as shown in FIG. 1 is completed as illustrated in FIG. 3E.

As described above, the semiconductor device according to the first embodiment has the BGA substrate 10 in which the heat radiating plate 5 is attached to the entire back surface, and the metal cap 8 which covers the opening H for holding or accommodating the relay wiring substrate 2 therein, is covered on the center of its surface. The relay wiring substrate 2 is bonded onto the heat radiating plate 5 with the thermal conductive bonding material 6. Hence the ASIC chip 1a and the memory chip 1b flip-chip connected to the relay wiring substrate 2 are connected to the metal cap 8 through the thermal conductive materials 9 interposed therebetween.

Thus, heat produced at each of the ASIC chip 1a and the memory chip 1b is conducted to the heat radiating plate 5 via the relay wiring substrate 2 and radiated outside. Further, the heat is conducted to the metal cap 8 through the thermal conductive materials 9 and then conducted from the metal cap 8 to the earth wire 22 of the mounting board through the solder 23, followed by being diffused. Therefore, the present semiconductor device has an advantage in that a radiating effect is enhanced as compared with the conventional semiconductor device in which the heat radiating plate is provided only on the back surface of the BGA substrate.

Second Preferred Embodiment

Figure 4:
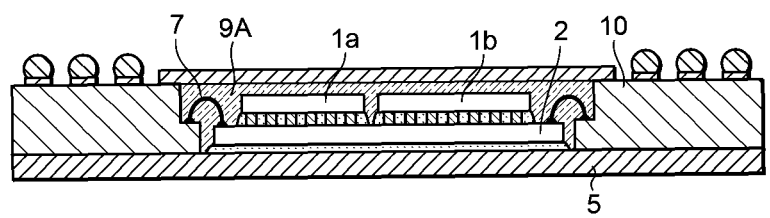
FIG. 4 is a configuration diagram of a semiconductor device showing a second embodiment of the present invention.

FIG. 4 is a configuration diagram of a semiconductor device showing a second embodiment of the present invention. Common reference numerals are respectively attached to elements common to those shown in FIG. 1.

The semiconductor device is equivalent to one in which as an alternative to the thermal conductive materials 9 employed in the semiconductor device shown in FIG. 1, a high thermal conductive resin or oil 9A having an insulating property is charged in such a manner that the whole relay wiring substrate 2 mounted in an opening H of a BGA substrate 10 is immersed therein.

A method for manufacturing the semiconductor device is simply different from the above method in that as an alternative to the application of the thermal conductive materials 9 onto the ASIC chip 1a and memory chip 1b at Step 4 in the first embodiment, the opening H is filled with the high thermal conducive resin or oil 9A in such a manner that the ASIC chip 1a and the memory chip 1b are completely immersed therein.

As described above, the semiconductor device according to the second embodiment has the BGA substrate 10 in which a heat radiating plate 5 is attached to its entire back surface, and a metal cap 8 which covers the opening H for holding or accommodating the relay wiring substrate 2 therein, is covered on the center of its surface. The relay wiring substrate 2 is bonded onto to the heat radiating plate 5 with a thermal conductive bonding material 6, and the opening H is filled thereinside with the high thermal conductive resin or oil 9A. Thus, advantages are brought about in that heat produced at each of the ASIC chip 1a and the memory chip 1b is uniformly conducted to the whole semiconductor device by the high thermal conductive resin or oil 9A, and the heat can effectively be diffused from the heat radiating plate 5 and the metal cap 8.

Incidentally, the present invention is not limited to the above-described embodiments. Various modifications are possible. As examples for the modifications, for example, the following are brought about.

The semiconductor chips mounted onto the relay wiring substrate 2 are not limited to the ASIC and the memory. The number thereof is not limited to the two either.

Although the semiconductor device using the BGA substrate 10 as the essential part of the package has been illustrated by way of example, the main wiring substrate of the package is not limited to the BGA substrate.

When the opening H is filled with the high thermal conductive resin or oil 9A as in the second embodiment, it is not necessary to charge the underfill resin 4 between the flip-chip connected ASIC chip 1a and memory chip 1b and the relay wiring substrate 2.

What is claimed is:

1. A method for manufacturing a semiconductor device, comprising:
    mounting a plurality of semiconductor chips over a relay wiring substrate by flip-chip connections;
    bonding a heat radiating plate to a back surface of a main wiring substrate which has an opening therethrough;
    bonding the relay wiring substrate equipped with the semiconductor chips to the heat radiating plate in the opening of the main wiring substrate using a bonding material having thermal conductivity;
    connecting bonding wires between the relay wiring substrate and the main wiring substrate;
    applying a thermal conductive material to each of back surfaces of the semiconductor chips; and
    covering the opening of the main wiring substrate with a metal sealing plate, so that the metal sealing plate is connected to the semiconductor chips by the thermal conductive material.

2. The method for manufacturing a semiconductor device of claim 1, wherein the semiconductor chips comprise a first chip that is an application specific integrated circuit (ASIC) chip and a second chip that is a memory chip.

3. The method for manufacturing a semiconductor device of claim 1, wherein the thermal conductive material comprises thermal conductive grease.

4. The method for manufacturing a semiconductor device of claim 1, wherein the thermal conductive material comprises thermal conductive gel.

5. The method for manufacturing a semiconductor device of claim 1, further comprising disposing the main wiring substrate on a mounting board by soldering the metal sealing plate directly to a ground wire of the mounting board.

6. The method for manufacturing a semiconductor device of claim 1, wherein the main wiring substrate is configured as a ball grid array substrate.

7. The method for manufacturing a semiconductor device of claim 1, wherein the heat radiating plate comprises copper.

8. A method for manufacturing a semiconductor device, comprising:
    mounting a plurality of semiconductor chips over a relay wiring substrate by flip-chip connections;
    bonding a heat radiating plate to a back surface of a main wiring substrate which has an opening therethrough;
    bonding the relay wiring substrate equipped with the semiconductor chips to the heat radiating plate in the opening of the main wiring substrate using a bonding material having thermal conductivity;
    connecting bonding wires between the relay wiring substrate and the main wiring substrate;
    filling the opening of the main wiring substrate with a thermal conductive material; and
    covering the opening of the main wiring substrate with a metal sealing plate.

9. The method for manufacturing a semiconductor device of claim 8, wherein the semiconductor chips comprise a first chip that is an application specific integrated circuit (ASIC) chip and a second chip that is a memory chip.

10. The method for manufacturing a semiconductor device of claim 8, wherein the thermal conductive material comprises thermal conductive resin.

11. The method for manufacturing a semiconductor device of claim 8, wherein the thermal conductive material comprises thermal conductive oil.

12. The method for manufacturing a semiconductor device of claim 8, further comprising disposing the main wiring substrate on a mounting board by soldering the metal sealing plate directly to a ground wire of the mounting board.

13. The method for manufacturing a semiconductor device of claim 8, wherein the main wiring substrate is configured as a ball grid array substrate.

14. The method for manufacturing a semiconductor device of claim 8, wherein the heat radiating plate comprises copper.

15. A method for manufacturing a semiconductor device, comprising:
  mounting a plurality of semiconductor chips over a relay wiring substrate by flip-chip connections;
  bonding a heat radiating plate to a back surface of a main wiring substrate which has an opening therethrough;
  bonding the relay wiring substrate equipped with the semiconductor chips to the heat radiating plate in the opening of the main wiring substrate using a bonding material having thermal conductivity;
  connecting bonding wires between the relay wiring substrate and the main wiring substrate; and
  attaching a metal sealing plate to the main wiring substrate to cover the opening and so that the metal sealing plate is in thermal contact with the semiconductor chips via a thermal conductive material.

16. The method for manufacturing a semiconductor device of claim 15, wherein the thermal conductive material is disposed only as substantially sandwiched between the metal sealing plate and the semiconductor chips.

17. The method for manufacturing a semiconductor device of claim 16, wherein the thermal conductive material is one of thermal conductive grease and thermal conductive gel.

18. The method for manufacturing a semiconductor device of claim 15, wherein the opening is filled with the thermal conductive material.

19. The method for manufacturing a semiconductor device of claim 18, wherein the thermal conductive material comprises one of thermal conductive resin and thermal conductive oil.

20. The method for manufacturing a semiconductor device of claim 15, further comprising disposing the main wiring substrate on a mounting board by soldering the metal sealing plate directly to a ground wire of the mounting board.

* * * * *